(12) United States Patent
Tischler et al.

(10) Patent No.: US 10,378,080 B2
(45) Date of Patent: Aug. 13, 2019

(54) SYSTEMS AND METHODS FOR RECYCLING ELECTRONIC SYSTEMS

(71) Applicants: Michael A. Tischler, Vancouver (CA); Calvin Wade Sheen, Chula Vista, CA (US)

(72) Inventors: Michael A. Tischler, Vancouver (CA); Calvin Wade Sheen, Chula Vista, CA (US)

(73) Assignee: COOLEDGE LIGHTING INC., Richmond, British Columbia (CA)

( * ) Notice: Subject to any disclaimer, the term of this patent is extended or adjusted under 35 U.S.C. 154(b) by 658 days.

(21) Appl. No.: 15/005,443

(22) Filed: Jan. 25, 2016

(65) Prior Publication Data
US 2016/0219763 A1    Jul. 28, 2016

Related U.S. Application Data

(60) Provisional application No. 62/106,911, filed on Jan. 23, 2015.

(51) Int. Cl.
*C22B 7/00* (2006.01)
*H05K 3/04* (2006.01)
*H05K 13/04* (2006.01)
*H05K 1/18* (2006.01)

(52) U.S. Cl.
CPC ............ *C22B 7/005* (2013.01); *H05K 3/043* (2013.01); *H05K 13/0486* (2013.01); *H05K 1/189* (2013.01); *H05K 2201/0145* (2013.01); *H05K 2201/10106* (2013.01); *H05K 2203/0108* (2013.01); *H05K 2203/0195* (2013.01); *H05K 2203/1545* (2013.01); *H05K 2203/178* (2013.01)

(58) Field of Classification Search
CPC ......................... H05K 2203/178; C22B 7/005
See application file for complete search history.

(56) References Cited

U.S. PATENT DOCUMENTS

2014/0160714 A1* 6/2014 Omura ................... H05K 13/04
                                                            361/807

FOREIGN PATENT DOCUMENTS

KR        101441860 B1 *  9/2014

* cited by examiner

*Primary Examiner* — Livius R. Cazan
(74) *Attorney, Agent, or Firm* — Morgan, Lewis & Bockius LLP

(57) ABSTRACT

In accordance with certain embodiments, devices are recycled by removing one or more electronic components from a portion of the device and urging one or more regions of the portion of the device toward an abrasion head. The abrasion head mechanically removes at least a portion of patternable material in each of the one or more regions. The steps are repeated for subsequent portions of the device.

23 Claims, 12 Drawing Sheets

SYSTEMS AND METHODS FOR RECYCLING ELECTRONIC SYSTEMS

RELATED APPLICATIONS

This application claims the benefit of and priority to U.S. Provisional Patent Application No. 62/106,911, filed Jan. 23, 2015, the entire disclosure of which is hereby incorporated herein by reference.

FIELD OF THE INVENTION

In various embodiments, the present invention relates generally to recycling of electronic systems, and more specifically to recycling systems featuring patterned multi-layer composite structures.

BACKGROUND

A variety of methods are used for patterning composite sheet or multi-layer materials, for example ink-on-paper, metal-on-plastic, or more generally, one or more materials to be patterned on a substrate material. Conventional patterning methods include subtractive processes that start with the composite structure and remove one or more portions of undesired material from a substrate, such as patterning and etching, laser etching or cutting, mechanical abrasion or the like, and additive processes that add the desired material to a substrate, such as printing (for example ink jet, gravure, flexographic, or other types of printing), plating, vapor phase deposition, and the like.

Many of these methods are not amenable to cost-effective fast turn-around processing because of the time and cost associated with the patterning process. For example, roll-to-roll processing using a gravure roller to form a resist on a composite structure and then etching off the desirable material and cleaning the final product is an efficient way to make very large quantities of a single design, using a single material. Such roll-to-roll processes can be cost-effective despite the relatively long time, high complexity, and high cost associated with making the gravure roller and starting up the process, since such costs can be amortized over the very large volumes. At the other end of the process spectrum, digital printers, for example ink jet or wax or other printers, can relatively very quickly adapt to new patterns, but these techniques are relatively slow to produce large patterned areas, thus increasing the cost significantly beyond that of relatively more high-volume processes. In addition, such digital printers typically do not have sufficient throughput to match the capacity of subsequent processes that rely on their output, e.g., the manufacture of flexible printed circuit boards. Finally, additive processes, particularly for addition of electrically conductive materials (e.g., for printed circuit boards), typically have significantly lower conductivity than bulk conductive materials, for two reasons. The first is that the conductivity of the printed materials, for example printable conductive inks, is not typically as high as the bulk metal. For example, the printed materials may typically have about 3 times to about 6 times lower conductivity. The second is that these printed materials often cannot be printed at the same thickness as the bulk material. For example, they may have a thickness about 5 times to about 50 times thinner than available bulk materials.

Finally, many of these conventional processes use relatively large amounts of energy as well as relatively hazardous and/or toxic chemicals and may produce significant waste. For example, systems for patterning copper or metal layers on a substrate require large chemical etch baths that may have high operational, maintenance and disposal costs associated with large amounts of potentially non-environmentally friendly chemicals and other waste.

Accordingly, there is a need for solutions that provide for low-cost, environmentally friendly, high-throughput, easily changeable patterning of layered structures of any length, particularly for roll-to-roll processing. Such solutions would also desirably be utilizable for recycling of such layered structures.

SUMMARY

In accordance with various embodiments of the present invention, patterns are formed via mechanical abrasion of a composite material that includes a patternable material disposed over a substrate. Specifically, programmable and controllable actuators are utilized to urge various portions of the composite material toward one or more abrasion stations where the patternable material is removed. Movement of the composite material and corresponding control of the actuators results in the formation of a desired two-dimensional pattern on the composite material. Embodiments of the invention therefore enable the very rapid formation of desired, user-defined patterns that need not be repetitive or confined to particular pattern dimensions or feature sizes. In addition, embodiments of the invention need not utilize chemical removal of the patternable material, saving materials costs in an environmentally friendly manner.

Exemplary patterning systems in accordance with embodiments of the present invention include or consist essentially of one or more abrasion stations positioned over a patterning head, and the composite material to be patterned passes between the abrasion station and the patterning head. The material to be patterned is removed by the abrasion station when the composite material is locally moved toward the abrasion station by the patterning head.

Patterning systems and techniques in accordance with embodiments of the present invention may also be utilized and adapted for the recycling of electronic structures, e.g., electronic systems incorporating patterned layered composite materials and electronic components (e.g., light-emitting elements) disposed thereover. In various embodiments, the recycling of such systems may include removal of the electronic components and the removal of the patterned patternable material, leaving the bare substrate from the composite material that may be separately recycled or reutilized. The patternable material may be removed from the composite material by urging the composite material toward one or more abrasion stations. The various steps in recycling processes in accordance with embodiments of the invention may be performed as parts of a roll-to-roll process.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of light-emitting elements include solid-state, organic, polymer, phosphor-coated or high-flux LEDs, laser diodes or other similar devices as would be readily understood. The emitted radiation of an LEE may be visible, such as red, blue or green, or invisible, such as infrared or ultraviolet. An LEE may produce radiation of a continuous or discontinuous spread of wavelengths. An LEE may feature a phosphorescent or fluorescent material, also known as a light-conversion material, for converting a portion of its emissions from one set of wavelengths to another. In some embodiments, the light from an LEE includes or consists essentially of a combination of light directly emitted by the LEE and light emitted by an adjacent or surrounding light-conversion material. An LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective. Herein the term "reflective" is defined as having a reflectivity greater than 65% for a wavelength of light emitted by the LEE on which the contacts are disposed unless otherwise defined. In some embodiments, an LEE may include or consist essentially of an electronic device or circuit or a passive device or circuit. In some embodiments, an LEE includes or consists essentially of multiple devices, for example an LED and a Zener diode for static-electricity protection. In some embodiments, an LEE may include or consist essentially of a packaged LED, i.e., a bare LED die encased or partially encased in a package. In some embodiments, the packaged LED may also include a light-conversion material. In some embodiments, the light from the LEE may include or consist essentially of light emitted only by the light-conversion material, while in other embodiments the light from the LEE may include or consist essentially of a combination of light emitted from an LED and from the light-conversion material. In some embodiments, the light from the LEE may include or consist essentially of light emitted only by an LED.

In one embodiment, an LEE includes or consists essentially of a bare semiconductor die, while in other embodiments an LEE includes or consists essentially of a packaged LED. In some embodiments, LEE may include or consist essentially of a "white die" that includes an LED that is integrated with a light-conversion material (e.g., a phosphor) before being attached to the light sheet, as described in U.S. patent application Ser. No. 13/748,864, filed Jan. 24, 2013, or U.S. patent application Ser. No. 13/949,543, filed Jul. 24, 2013, the entire disclosure of each of which is incorporated by reference herein.

In an aspect, embodiments of the invention feature a method of recycling a device that includes, consists essentially of, or consists of a plurality of electronic components disposed over a composite material. The composite material includes, consists essentially of, or consists of a substrate and a patternable material disposed thereover. The patternable material is patterned to form a pattern therein. A portion of the device is received. One or more electronic components are removed from the received portion of the device. One or more regions of the received portion of the device are urged toward an abrasion head, whereby the abrasion head mechanically removes at least a portion of the patternable material in each of the one or more regions. Those steps are repeated for one or more portions of the device.

Embodiments of the invention may include one or more of the following in any of a variety of combinations. Removing the one or more electronic components from the received portion of the device may include, consist essentially of, or consist of mechanical scraping. The received portion of the device may be urged toward the abrasion head by one or more actuators (e.g., mechanical actuators, pneumatic actuators, hydraulic actuators, electric actuators, thermal actuators, magnetic actuators, linear actuators, piezoelectric actuators, etc.). The received portion of the device may be disposed between the abrasion head and the one or more actuators. The one or more actuators may be disposed above or below the received portion of the device. The one or more removed electronic components may be stored (e.g., in a bin or other receptacle) after removal thereof. The removed at least a portion of the patternable material may be stored (e.g., in a bin or other receptacle) after removal thereof. The receiving of the portion of the device, the removal of the one or more electronic components, and the urging of the one or more regions of the received portion of the device toward the abrasion head may be performed as steps in a roll-to-roll process. For example, the portion of the device may be received from a supply reel, and/or the received portion of the device may be transferred to a take-up reel after removal of the one or more electronic components and the urging of the one or more regions of the received portion of the device toward the abrasion head.

In another aspect, embodiments of the invention feature a method of recycling a device that includes, consists essentially of, or consists of a plurality of electronic components disposed over a composite material. The composite material includes, consists essentially of, or consists of a substrate and a patternable material disposed thereover. The patternable material is patterned to form a pattern therein. A portion of the device is received. One or more electronic components are removed from the received portion of the device. At least a portion of the patternable material is removed from the received portion of the device. Those steps are repeated for one or more portions of the device. The receiving of the portion of the device, the removal of the one or more electronic components, and the removal of the at least a portion of the patternable material may be performed as steps in a roll-to-roll process. For example, the portion of the device may be received from a supply reel, and/or the received portion of the device may be transferred to a take-up reel after removal of the one or more electronic components and the at least a portion of the patternable material.

Embodiments of the invention may include one or more of the following in any of a variety of combinations. Removing the one or more electronic components from the received portion of the device may include, consist essentially of, or consist of mechanical scraping. Removing the at least a portion of the patternable material from the received portion of the device may include, consist essentially of, or consist of urging the received portion of the device toward an abrasion head, whereby the abrasion head mechanically removes at least a portion of the patternable material from the received portion of the device. The received portion of the device may be urged toward the abrasion head by one or more actuators (e.g., mechanical actuators, pneumatic actuators, hydraulic actuators, electric actuators, thermal actuators, magnetic actuators, linear actuators, piezoelectric actuators, etc.). The received portion of the device may be disposed between the abrasion head and the one or more actuators. The one or more actuators may be disposed above or below the received portion of the device. The one or more removed electronic components may be stored (e.g., in a bin or other receptacle) after removal thereof. The removed at least a portion of the patternable material may be stored (e.g., in a bin or other receptacle) after removal thereof.

In yet another aspect, embodiments of the invention feature a system for recycling a device that includes, consists essentially of, or consists of a plurality of electronic components disposed over a composite material. The composite material includes, consists essentially of, or consists of a substrate and a patternable material disposed thereover. The patternable material is patterned to form a pattern therein. The system includes, consists essentially of, or consists of a component-removal station, an abrasion station, a patterning head, and a material handling system. The component-removal station includes, consists essentially of, or consists of means for removing electronic components from the composite material. The abrasion station includes, consists essentially of, or consists of means for removing patternable material from the substrate. The patterning head includes, consists essentially of, or consists of means for urging portions of the composite material toward the abrasion station. The material handling system transfers successive portions of the composite material to the component-removal station, the abrasion station, and the patterning head.

Embodiments of the invention may include one or more of the following in any of a variety of combinations. The means for removing patternable material may include, consist essentially of, or consist of one or more abrasion heads. The means for removing patternable material may include, consist essentially of, or consist of one or more milling or grinding wheels, one or more ultrasonic milling tools, and/or one or more ablation tools. The means for urging portions of the composite material toward the abrasion station may include, consist essentially of, or consist of one or more actuators (e.g., mechanical actuators, pneumatic actuators, hydraulic actuators, electric actuators, thermal actuators, magnetic actuators, linear actuators, piezoelectric actuators, etc.). The material handling system may include, consist essentially of, or consist of (i) a supply reel for supplying the composite material to component-removal station, the abrasion station, and the patterning head, and (ii) a take-up reel for receiving the composite material from component-removal station, the abrasion station, and the patterning head. The means for removing electronic components from the composite material may include, consist essentially of, or consist of a mechanical scraper. The system may include a receptacle for receiving removed electronic components and/or a receptacle for receiving removed patternable material.

In another aspect, embodiments of the invention feature a method of forming a pattern in a composite material. The composite material includes, consists essentially of, or consists of a substrate and a patternable material disposed thereover. In a step (a), a portion of the composite material is disposed proximate (e.g., above or beneath) an abrasion head. In a step (b), one or more regions of the portion of the composite material are selectively urged toward the abrasion head, whereby the abrasion head mechanically removes at least a portion of the patternable material in each of the one or more regions. In a step (c), the composite material is translated with respect to the abrasion head, thereby disposing a new portion of the composite material proximate the abrasion head.

The composite material may be moved relative to the abrasion head, the abrasion head may be moved relative to the composite material, or both the composite material and the abrasion head may be moved relative to each other. In a step (d), steps (b) and (c) are repeated one or more times to form the pattern.

Embodiments of the invention may include one or more of the following in any of a variety of combinations. The one or more regions of the portion of the composite material may be urged toward the abrasion head by one or more actuators (e.g., mechanical actuators, pneumatic actuators, hydraulic actuators, electric actuators, thermal actuators, magnetic actuators, linear actuators, piezoelectric actuators, etc.). The composite material may be disposed between the abrasion head and the one or more actuators. The one or more actuators may be disposed above or beneath the composite material. The composite material may be translated with respect to the abrasion head without moving, translating, or rotating the one or more actuators. The one or more regions of the portion of the composite material may be heated prior to and/or during step (b). The composite material may be in the form of a web dispensed from a supply reel. The composite material may be suspended between the supply reel and a take-up reel. Portions of the composite material may be transferred to a take-up reel after portions of the pattern are formed thereon. The substrate may be flexible. The patternable material may include, consist essentially of, or consist of one or more metals. In a step (e), an adhesive may be dispensed on one or more sites within the pattern. In a step (f), an electronic component may be disposed on the adhesive at the one or more sites. In a step (g), the adhesive may be cured, thereby bonding the electronic components to the composite material. One or more of the electronic components may include, consist essentially of, or consist of a light-emitting element. The light-emitting element may include, consist essentially of, or consist of a light-emitting diode. In a step (h), one or more of the light-emitting elements may be electro-optically tested (i.e., a current and/or voltage may be applied to the one or more light-emitting elements, and one or more properties (e.g., intensity, color temperature, etc.) of the resulting emitted light may be evaluated). Steps (a)-(g) may be performed as parts of a roll-to-roll process. In a step (h), one or more of the electronic components may be electronically tested. A computational representation of the pattern may be stored (e.g., electronically stored within a computer memory). A set of data corresponding to a substantially linear portion of the pattern may be extracted from the computational representation and step (b) may be performed in accordance with the data.

In yet another aspect, embodiments of the invention feature a system for the formation of a pattern in a composite material. The composite material includes, consists essentially of, or consists of a substrate and a patternable material disposed thereover. The system includes, consists essentially of, or consists of an abrasion station, a patterning head, a material handling system, and circuitry. The abrasion station includes, consists essentially of, or consists of means for removing patternable material from the substrate. The patterning head includes, consists essentially of, or consists of means for selectively urging portions of the composite material toward the abrasion station. The material handling system transfers successive portions of the composite material to the abrasion station and the patterning head. The circuitry controls the patterning head and the material handling system to create a substantially linear portion of the pattern in each successively transferred portion of the composite material.

Embodiments of the invention may include one or more of the following in any of a variety of combinations. The circuitry may include, consist essentially of, or consist of a computer-based controller for controlling the patterning head and the material handling system. The controller may control the abrasion station. The computer-based controller may include, consist essentially of, or consist of a computer memory and a rendering module. The computer memory may store a computational representation of the pattern. The rendering module may extract sets of data corresponding to successive substantially linear portions from the computational representation. The controller may cause the patterning head and the material handling system to form successive substantially linear portions of the pattern in accordance with the data. The means for removing patternable material may include, consist essentially of, or consist of one or more abrasion heads. The means for removing patternable material may include, consist essentially of, or consist of one or more milling or grinding wheels, one or more ultrasonic milling tools, and/or one or more ablation tools. The means for selectively urging portions of the composite material toward the abrasion station may include, consist essentially of, or consist of one or more actuators (e.g., mechanical actuators, pneumatic actuators, hydraulic actuators, electric actuators, thermal actuators, magnetic actuators, linear actuators, piezoelectric actuators, etc.). The one or more actuators may include, consist essentially of, or consist of a plurality of discrete actuators separated by a spacing therebetween. The spacing may range from approximately 10 µm to approximately 1 mm. A lateral dimension (e.g., diameter, width, etc.) of each said actuator may range from approximately 10 µm to approximately 1 mm. The material handling system may include, consist essentially of, or consist of a supply reel for supplying the composite material to the abrasion station and the patterning head and a take-up reel for receiving the composite material from the abrasion station and the patterning head. The system may include an adhesive dispenser positioned (i) downstream of the patterning head and (ii) to dispense adhesive over patterned composite material. The system may include a component-placement tool positioned (i) downstream of the adhesive dispenser and (ii) to place one or more electronic components over the dispensed adhesive. The system may include an adhesive-curing tool positioned (i) downstream of the component-placement tool and (ii) to cure the dispensed adhesive, whereby the one or more electronic components are bonded via cured adhesive to the patterned composite material. The system may include a testing station positioned (i) downstream of the adhesive-curing tool and (ii) to test (e.g., electronically test, opto-electronically test, etc.) at least one said bonded electronic component.

In another aspect, embodiments of the invention feature a method of forming a pattern in a composite material. The composite material includes, consists essentially of, or consists of a substrate and a patternable material disposed thereover. In a step (a), a computational representation of the pattern is electronically stored (e.g., in a computer memory). In a step (b), a portion of the composite material is disposed proximate (e.g., above or beneath) an abrasion head. In a step (c), a set of data corresponding to a substantially linear portion of the pattern is extracted from the computational representation. In a step (d), in accordance with the extracted set of data, one or more regions of the portion of the composite material are selectively urged toward the abrasion head, whereby the abrasion head mechanically removes at least a portion of the patternable material in each of the one or more regions. In a step (e), the composite material is translated with respect to the abrasion head, thereby disposing a new portion of the composite material proximate the abrasion head. The composite material may be moved relative to the abrasion head, the abrasion head may be moved relative to the composite material, or both the composite material and the abrasion head may be moved relative to each other. In a step (f), steps (b)-(e) are repeated one or more times to form the pattern.

Embodiments of the invention may include one or more of the following in any of a variety of combinations. The one or more regions of the portion of the composite material may be urged toward the abrasion head by one or more actuators (e.g., mechanical actuators, pneumatic actuators, hydraulic actuators, electric actuators, thermal actuators, magnetic actuators, linear actuators, piezoelectric actuators, etc.). The composite material may be disposed between the abrasion head and the one or more actuators. The one or more actuators may be disposed above or beneath the composite material. The composite material may be translated with respect to the abrasion head without moving, translating, or rotating the one or more actuators. The one or more regions of the portion of the composite material may be heated prior to and/or during step (d). The composite material may be in the form of a web dispensed from a supply reel. The composite material may be suspended between the supply reel and a take-up reel. Portions of the composite material may be transferred to a take-up reel after portions of the pattern are formed thereon. The substrate may be flexible. The patternable material may include, consist essentially of, or consist of one or more metals. In a step (g), an adhesive may be dispensed on one or more sites within the pattern. In a step (h), an electronic component may be disposed on the adhesive at the one or more sites. In a step (i), the adhesive may be cured, thereby bonding the electronic components to the composite material. One or more of the electronic components may include, consist essentially of, or consist of a light-emitting element. The light-emitting element may include, consist essentially of, or consist of a light-emitting diode. In a step (j), one or more of the light-emitting elements may be electro-optically tested (i.e., a current and/or voltage may be applied to the one or more light-emitting elements, and one or more properties (e.g., intensity, color temperature, etc.) of the resulting emitted light may be evaluated). Steps (b)-(i) may be performed as parts of a roll-to-roll process. In a step (j), one or more of the electronic components may be electronically tested.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. As used herein, the terms "about," "approximately," and "substantially" mean ±10%, and in some embodiments, ±5%. The term "consists essentially of" means excluding other materials that contribute to function, unless otherwise defined herein. Nonetheless, such other materials may be present, collectively or individually, in trace amounts.

Herein, two components such as light-emitting elements and/or optical elements being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other. Substrates, light sheets, components, and/or portions thereof described as "reflective" may be specularly reflective or diffusively reflective unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
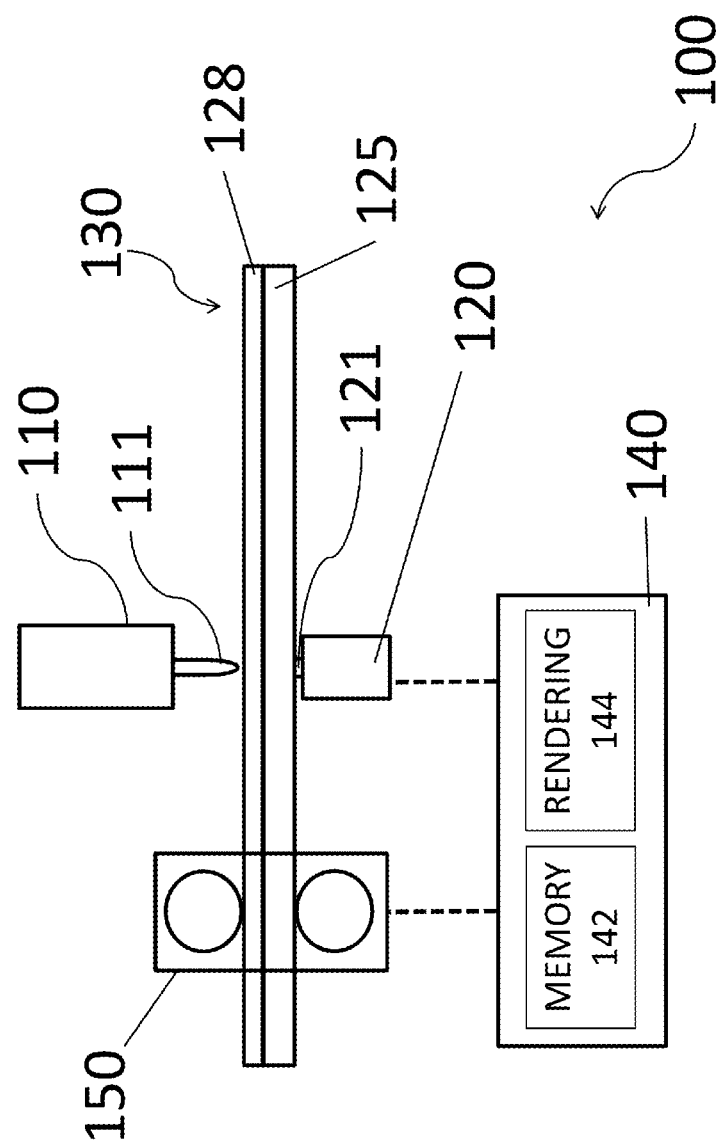
FIGS. 1A-1F are cross-sectional schematics of patterning systems in accordance with various embodiments of the invention.
Figure 1B:
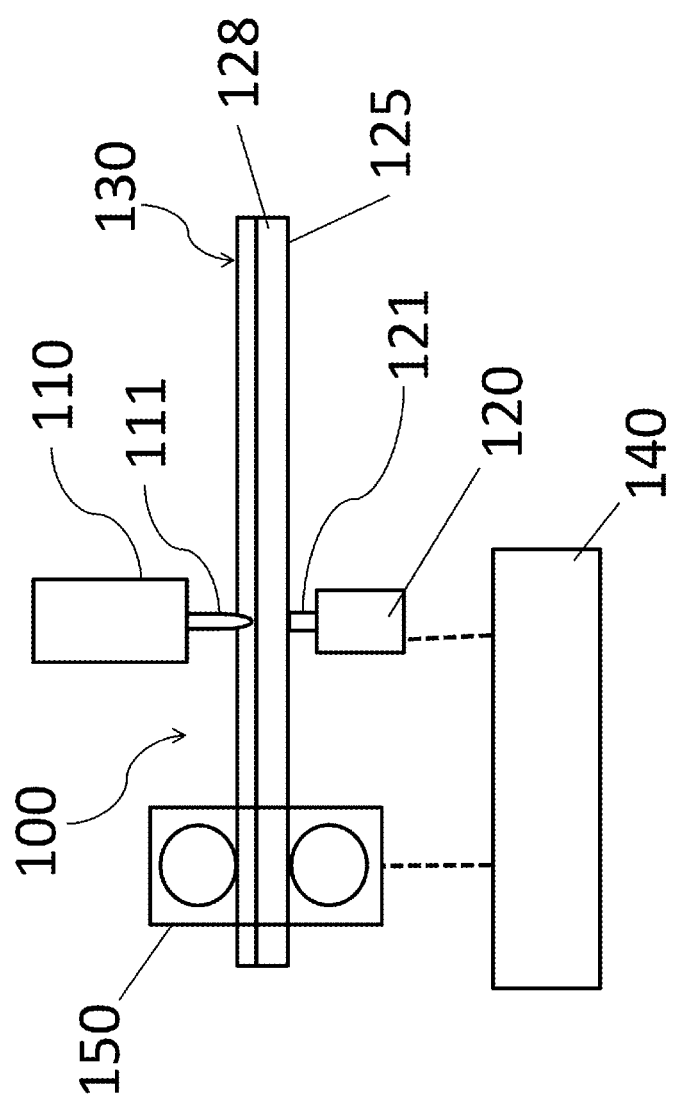

FIGS. 1A-1F depict an exemplary patterning system 100, in accordance with embodiments of the present invention, which features a controller 140, an abrasion station 110, a patterning head 120, and a material handling system 150. As shown patterning system 100 may be utilized to pattern a composite material 130 that includes, consists essentially of, or consists of a substrate 125 and a patternable material (material to be patterned) 128. Patterning head 120 typically includes multiple actuators 121 along the width of the head (into the page of FIG. 1A), and each actuator 121, when actuated, raises composite material 130 such that patternable material 128 is moved into the processing range of abrasion station 110, resulting in removal of the patternable material 128 at that position along the width of abrasion station 110. Abrasion station 110 includes an abrasion head 111, which is capable of abrading patternable material 128. The actuators 121 are individually addressable and controllable, and controller 140 energizes each actuator 121 in patterning head 120 according to a user-defined program or recipe. Thus, a line pattern is formed in patternable material 128 along the width of patterning head 120, and, as the composite material 130 feeds through the patterning system 100, a desired two-dimensional pattern is formed line-by-line. FIG. 1A shows actuator 121 in a non-energized position, such that patternable material 128 is not being abraded by abrasion station 110, while FIG. 1B shows actuator 121 in an energized position, such that a portion of patternable material 128 is being removed by abrasion station 110. In various embodiments of the present invention, composite material 130 may be relatively stiff and exhibit partial or substantially no deformation around actuator 121, as shown in FIG. 1B; however, this is not a limitation of the present invention, and in other embodiments composite material 130 may be pliant or deformable and deform or partially deform around actuator 121 when it is energized and/or un-energized.

The controller 140 in accordance with embodiments of the invention may include, for example, a computer memory 142 and a rendering module 144. Computational representations of two-dimensional patterns may be stored in the computer memory 142, and the rendering module 144 may extract sets of data corresponding to successive linear portions of a desired two-dimensional pattern from the computational representation. The controller 140 may control the patterning head 120 (including actuators 121) and material handling system 150 to form successive linear portions of stored patterns in accordance with the data. The controller 140 may also control abrasion station 110 (including abrasion head 111). The desired pattern may be a pattern stored in the computer memory 142 and selected by a user of patterning system 100, or the pattern may be directly input by a user into controller 140 via, e.g., one or more input devices such as keyboards, computer mice, other pointing devices, touchscreens, etc.

The controller 140 in accordance with embodiments of the present invention may include or consist essentially of a general-purpose computing device in the form of a computer including a processing unit (or "computer processor"), a system memory, and a system bus that couples various system components including the system memory to the processing unit. Computers typically include a variety of computer-readable media that can form part of the system memory and be read by the processing unit. By way of example, and not limitation, computer readable media may include computer storage media and/or communication media. The system memory may include computer storage media in the form of volatile and/or nonvolatile memory such as read only memory (ROM) and random access memory (RAM). A basic input/output system (BIOS), containing the basic routines that help to transfer information between elements, such as during start-up, is typically stored in ROM. RAM typically contains data and/or program modules that are immediately accessible to and/or presently being operated on by processing unit. The data or program modules may include an operating system, application programs, other program modules, and program data. The operating system may be or include a variety of operating systems such as Microsoft WINDOWS operating system, the Unix operating system, the Linux operating system, the Xenix operating system, the IBM AIX operating system, the Hewlett Packard UX operating system, the Novell NETWARE operating system, the Sun Microsystems SOLARIS operating system, the OS/2 operating system, the BeOS operating system, the MACINTOSH operating system, the APACHE operating system, an OPENSTEP operating system or another operating system of platform.

Any suitable programming language may be used to implement without undue experimentation the functions described herein. Illustratively, the programming language used may include assembly language, Ada, APL, Basic, C, C++, C*, COBOL, dBase, Forth, FORTRAN, Java, Modula-2, Pascal, Prolog, Python, REXX, Matlab, Labview, R, and/or JavaScript for example. Further, it is not necessary that a single type of instruction or programming language be utilized in conjunction with the operation of systems and techniques of the invention. Rather, any number of different programming languages may be utilized as is necessary or desirable.

The computing environment may also include other removable/nonremovable, volatile/nonvolatile computer storage media. For example, a hard disk drive may read or write to nonremovable, nonvolatile magnetic media. A magnetic disk drive may read from or write to a removable, nonvolatile magnetic disk, and an optical disk drive may read from or write to a removable, nonvolatile optical disk such as a CD-ROM or other optical media. Other removable/nonremovable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The storage media are typically connected to the system bus through a removable or non-removable memory interface.

The processing unit that executes commands and instructions may be a general-purpose computer processor, but may utilize any of a wide variety of other technologies including special-purpose hardware, a microcomputer, mini-computer, mainframe computer, programmed micro-processor, microcontroller, peripheral integrated circuit element, a CSIC (Customer Specific Integrated Circuit), ASIC (Application Specific Integrated Circuit), a logic circuit, a digital signal processor, a programmable logic device such as an FPGA (Field Programmable Gate Array), PLD (Programmable Logic Device), PLA (Programmable Logic Array), RFID processor, smart chip, or any other device or arrangement of devices that is capable of implementing the steps of the processes of embodiments of the invention.

Figure 1C:
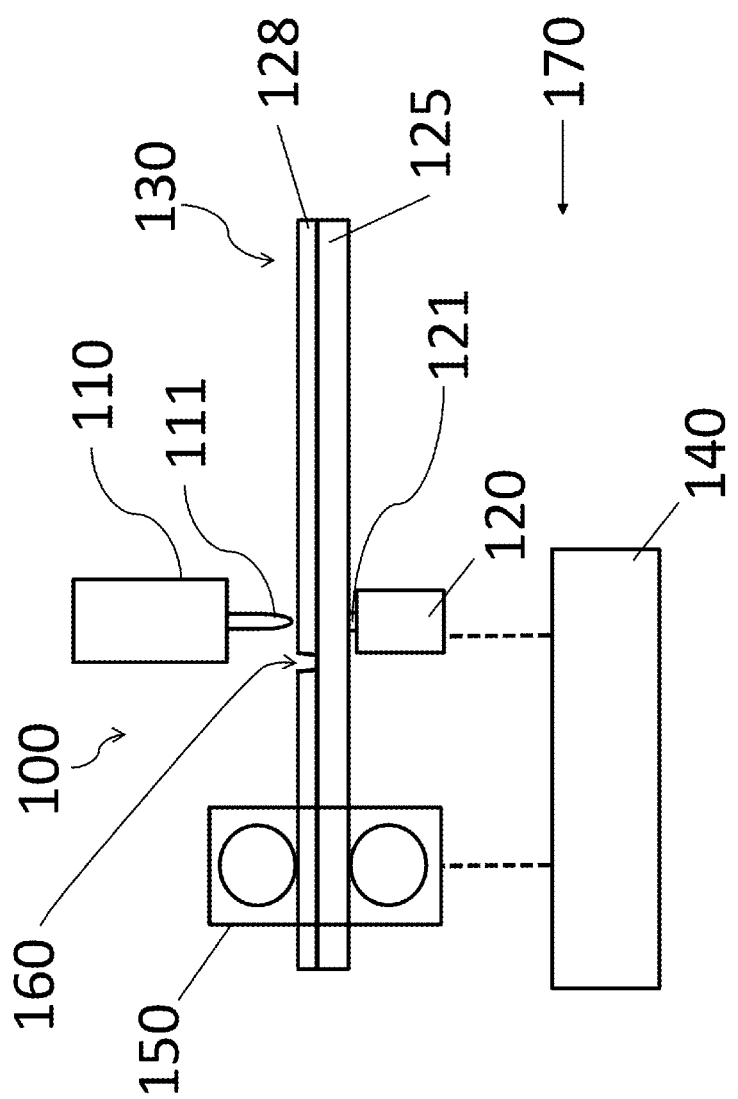

As mentioned above, after formation of one line of a desired two-dimensional pattern, the composite material 130 is moved in a direction 170 substantially orthogonal to the width of patterning head 120 by material handling system 150 to produce a two-dimensional pattern in patternable material 128. The controller 140 energizes different actuators as the composite material 130 is moved through abrasion station 110 and patterning head 120 in a direction substantially orthogonal to the width of pattern head 120. FIG. 1C shows the system of FIG. 1B at a later stage in time. A void 160 in patternable material 128 is formed when abrasion station 110 removes a portion of the patternable material 128. In this example, actuator 121 was de-energized before or as composite material 130 was moved in direction 170, leaving the void 160 surrounded by unaltered patternable material 128 in the direction 170. If actuator 121 were not de-energized, the structure may resemble that shown in FIG. 1D, in which void 161 is extended in length in direction 170.

Figure 1D:
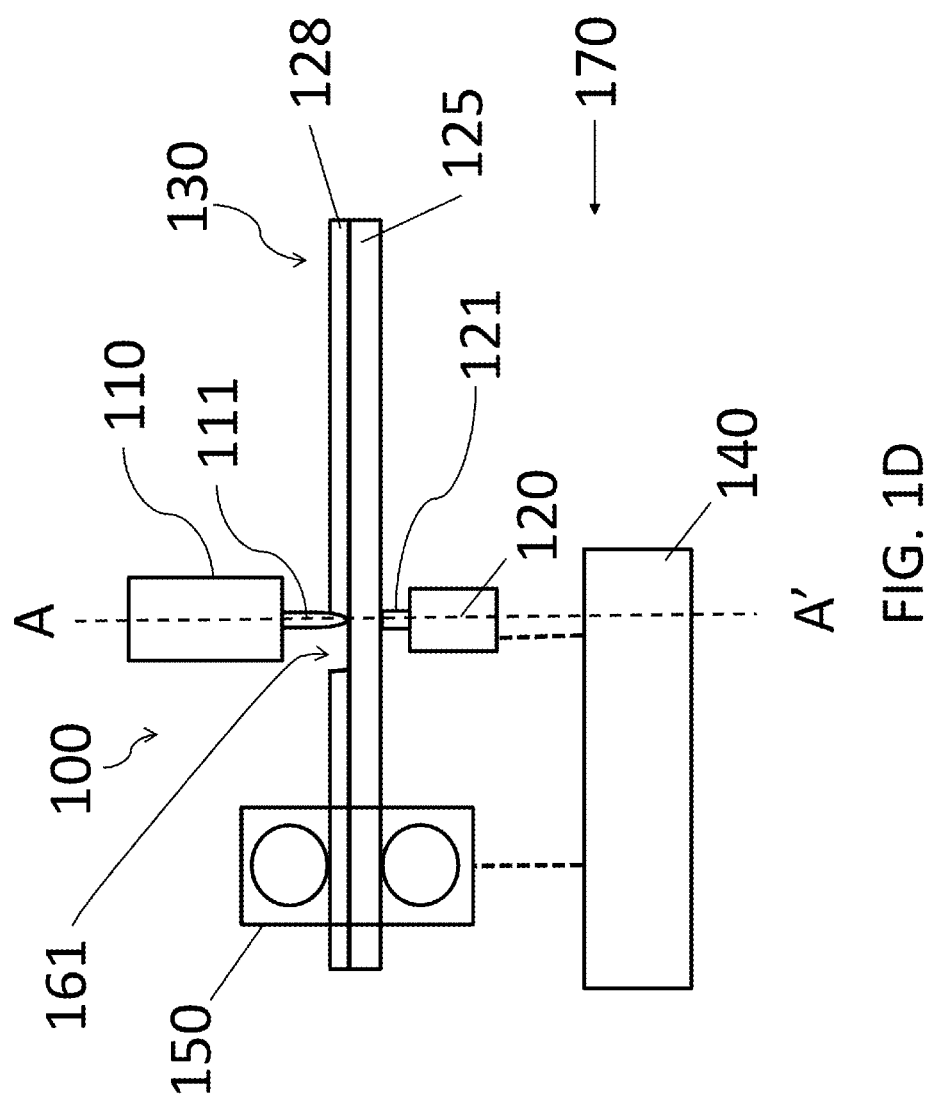
Figure 1E:
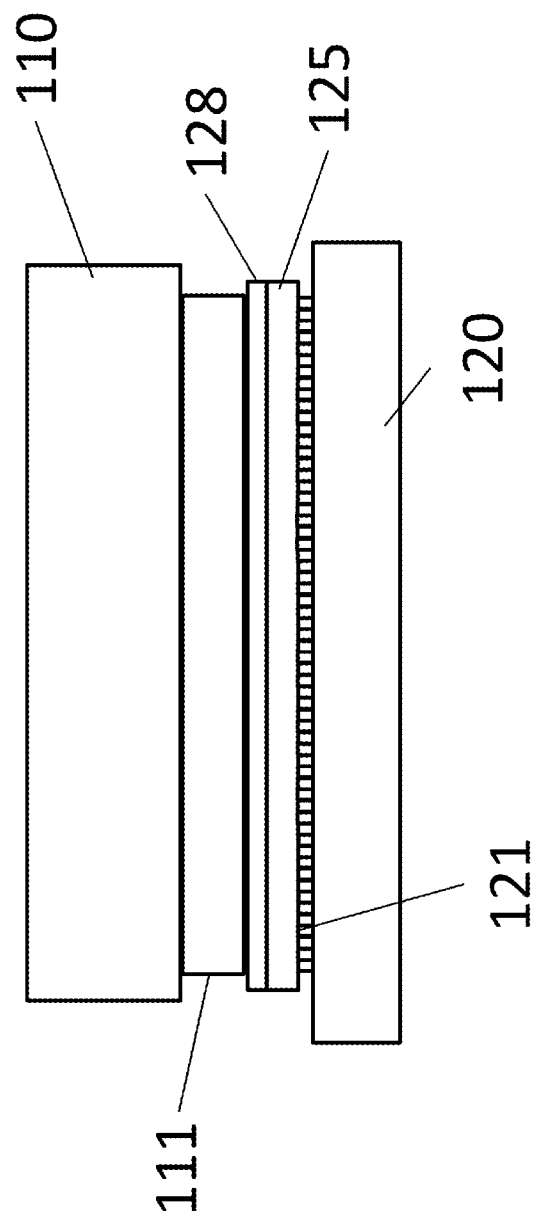
Figure 1F:
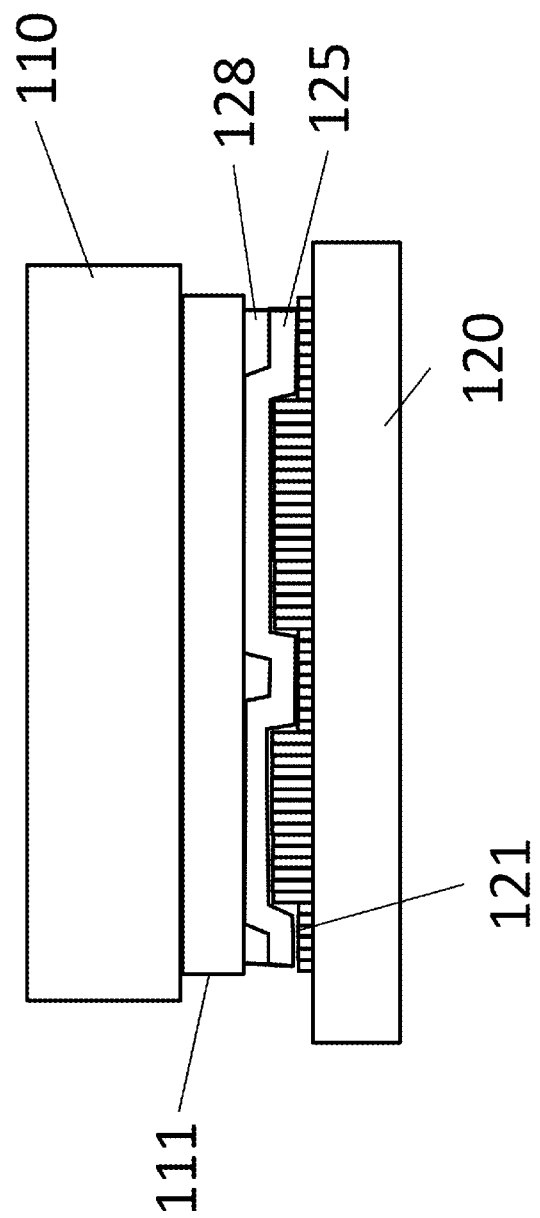
Figure 1G:
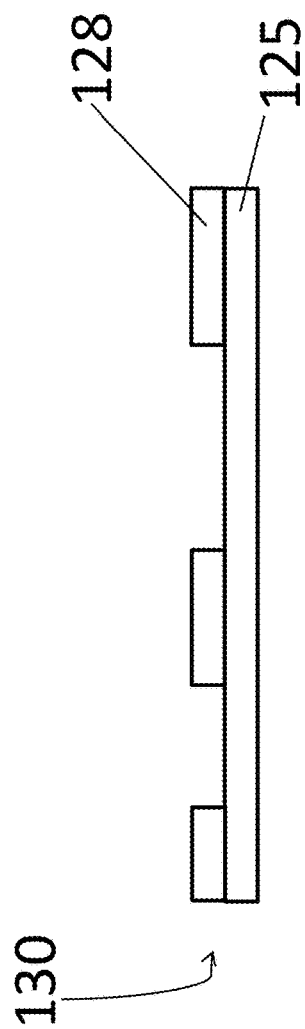
FIG. 1G is a cross-sectional schematic of a patterned substrate in accordance with various embodiments of the invention.

FIG. 1E shows a cross-sectional view of the structure of FIG. 1D through cut line A-A' of FIG. 1D. FIG. 1E shows multiple actuators 121 across the width of patterning head 120. In various embodiments, abrasion head 111 may include or consist essentially of a single-piece or continuous abrasion head, while in other embodiments abrasion head 111 may include or consist essentially of multiple abrasion heads (for example, each corresponding to the approximate location of one or more of the actuators 121). FIG. 1E shows the patterning system with all actuators 121 in the de-energized state. FIG. 1F shows the patterning system with some of the actuators 121 energized. As may be seen, substrate 125 and patternable material 128 are deformed by actuators 121, such that the patternable material 128 over energized actuators 121 is brought into contact with the abrasion head 111, and the patternable material 128 is removed in these regions, while patternable material 128 over de-energized actuators 121 is not brought into contact with abrasion head 111, and patternable material 128 is not removed in those regions, as shown in FIG. 1G. FIG. 1G shows an example of composite material 130 with portions of patternable material 128 removed, after patterning.

In various embodiments of the present invention, controller 140 may repeat the pattern after a certain length of composite material 130 has passed through abrasion station 110 and patterning head 120, while in other embodiments the pattern may not repeat. In various embodiments, composite material 130 may be in sheet form, while in others composite material 130 may be in roll or web form. In various embodiments, composite material 130 may be moved through abrasion station 110 and patterning head 120 using material handling system 150 that is also controlled by controller 140 and synchronized with pattern head 120, to produce the desired line pattern along the length of composite material 130, as shown in FIG. 1A, and the desired two-dimensional pattern in patternable material 128 over the area of composite material 130. In various embodiments, abrasion head 110 may include or consist essentially of one or more milling or grinding wheels, ultrasonic milling tools, and/or ablation tools, for example a sand or bead blaster, or the like.

Four key aspects of embodiments of the present invention are (1) the pattern of composite material 130 may be changed very easily by changing the instructions or recipe for controller 140, (2) there is no restriction on repeat dimensions, as may be the case for processes in which repeating pattern units are dictated by a pre-designed wheel, stamp, or roller with a fixed dimension or circumference, (3) the process does not use any chemicals for removal of the patternable material (although the composite material may be rinsed or otherwise cleaned to remove any dust or particulates before and/or after abrasive removal of the patternable material), and (4) the process may be performed very rapidly.

Figure 2:
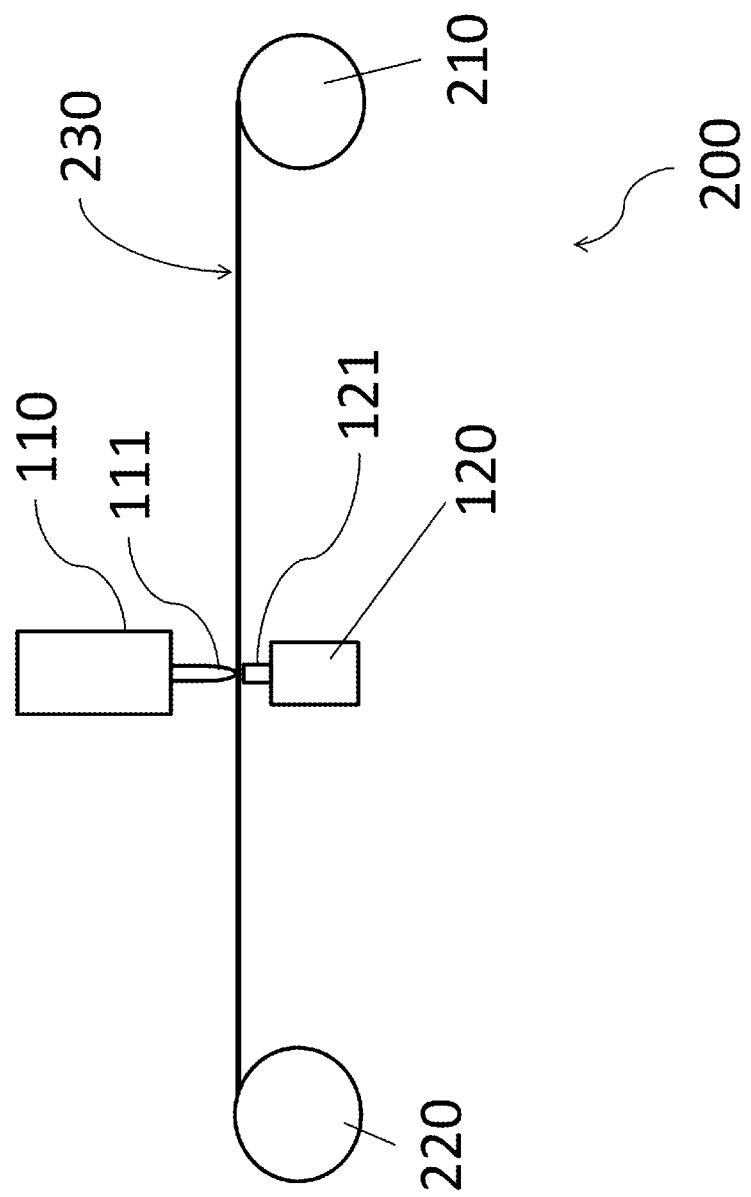
FIG. 2 is a cross-sectional schematic of a roll-to-roll patterning system in accordance with various embodiments of the invention.

In various embodiments, the process may be performed in a roll-to-roll configuration, for example as shown for patterning system 200 in FIG. 2 (the control system is not shown in FIG. 2 for clarity). Patterning system 200 is similar to the system of FIG. 1A; however, in FIG. 2 material handling system 150 is replaced by a roll-to-roll material handling system that includes or consists essentially of a supply reel 210 and a take-up reel 220, and web 230 is utilized instead of sheets of composite material 130. In various embodiments, web 230 includes or consists essentially of composite material 130 in web form (not sheet form).

In various embodiments, substrate 125 may include or consist essentially of a semicrystalline or amorphous material, e.g., polyethylene naphthalate (PEN), polyethylene terephthalate (PET), polycarbonate, polyethersulfone, polyester, polyimide, polyethylene, fiberglass, FR4, glass, metal core printed circuit board, (MCPCB), and/or paper. In various embodiments of the present invention, substrate 125 may include multiple layers. Depending upon the desired application for which embodiments of the invention are utilized, substrate 125 may be substantially transparent, translucent, or opaque. For example, substrate 125 may exhibit a transmittance or a reflectivity greater than 70% for wavelengths ranging between approximately 400 nm and approximately 700 nm. In various embodiments, substrate 125 may be substantially insulating, and may have an electrical resistivity greater than approximately 100 ohm-cm, greater than approximately $1 \times 10^6$ ohm-cm, or even greater than approximately $1 \times 10^{10}$ ohm-cm. In various embodiments, substrate 125 may have a thickness in the range of about 10 µm to about 5 mm; however, the thickness of substrate 125 is not a limitation of the present invention.

In various embodiments, the substrate 125 is "flexible" in the sense of being pliant in response to a force such that the substrate may be easily bent or otherwise deformed without damage thereto. The substrate 125 may also be resilient, i.e., tending to elastically resume an original configuration upon removal of the force. In some embodiments, a flexible substrate 125 is configurable to a radius of curvature of about 1 m or less, or about 0.5 m or less, or even about 0.1 m or less. In some embodiments, flexible substrate 125 has a Young's Modulus less than about 100 N/m$^2$, less than about 50 N/m$^2$, or even less than about 10 N/m$^2$. In some embodiments, a flexible substrate 125 has a Shore A hardness value less than about 100; a Shore D hardness less than about 100; and/or a Rockwell hardness less than about 150.

Patternable material 128 may be formed on substrate 125 by a variety of means, for example including physical deposition, vapor phase deposition, chemical vapor phase deposition, plating, lamination, evaporation, sputtering, doctor blade formation, or the like. The method of forming patternable material 128 on substrate 125 is not a limitation of the present invention. In various embodiments, patternable material 128 may have a thickness in the range of about 1 μm to about 5 mm; however, the thickness of patternable material 128 is not a limitation of the present invention. In various embodiments, patternable material 128 may include or consist essentially of a conductive material (e.g., an ink or a metal, metal film or other conductive materials or the like), which may include one or more elements such as silver, gold, aluminum, chromium, copper, and/or carbon. In various embodiments, conductive patternable material 128 may have a thickness in the range of about 50 nm to about 1000 μm.

In various embodiments, substrate 125 may include or consist essentially of one more materials such as metal, paper, plastic, fabric, leather, ceramic, or the like. In various embodiments, patternable material 128 may include or consist essentially of one or more materials such as metal, paper, plastic, fabric, leather, ceramic, or the like. In general, patternable material 128 is composed of one or more materials having mechanical properties and/or thicknesses enabling the material to be removed by abrasion head 111 (e.g., by abrasion, ultrasound milling, etc.).

While examples of composite material 130 have been described as having two layers, a substrate and a patternable material, this is not a limitation of the present invention, and in other embodiments composite material 130 may include, consist essentially of, or consist of one layer or more than two layers.

In various embodiments, all or a portion of patternable material 128 may be covered or encapsulated. In some embodiments, a layer of material, for example an insulating material, may be disposed over all or a portion of patternable material 128. Such a material may include, e.g., a sheet of material such as used for substrate 125, a printed layer, for example using screen, ink jet, stencil or other printing means, a laminated layer, or the like. Such a printed layer may include, for example, an ink, a plastic and oxide, or the like. The covering material and/or the method by which it is applied are not limitations of the present invention.

In various embodiments, composite material 130, substrate 125 and/or patternable material 128 may have a Young's Modulus less than about 50×10$^9$ N/m$^2$, less than about 10×10$^9$ N/m$^2$, or even less than about 5×10$^9$ N/m$^2$. In some embodiments, composite material 130, substrate 125 and/or patternable material 128 may have a Shore A hardness value less than about 100; a Shore D hardness less than about 100; and/or a Rockwell hardness less than about 150.

Figure 3:
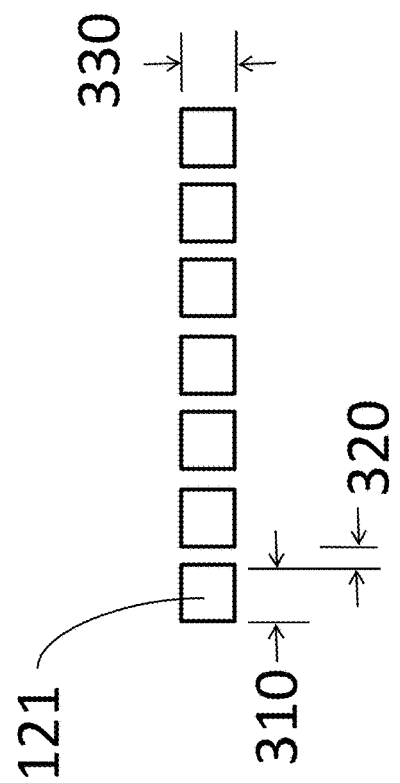
FIG. 3 is a plan-view schematic of patterning actuators in accordance with various embodiments of the invention.

In various embodiments of the present invention, the pattern resolution achievable in patternable material 128 may be related to the thickness of patternable material 128, the deformability or pliability of composite substrate 130, and/or the size of actuators 121 and abrasion head 111. FIG. 3 shows a schematic top view of some of the actuators 121 of patterning head 120. In the example shown in FIG. 3, actuators 121 have a square cross-section; however, this is not a limitation of the present invention, and in other embodiments actuators 121 may have different cross-sectional shapes, for example circular, triangular, hexagonal, or the like. In various embodiments, actuators 121 may have a size in the range of about 10 μm to about 1 mm; however, the actual size of an actuator 121 is not a limitation of the present invention. FIG. 3 shows a schematic of square actuators 121, having dimensions 310 and 330, which for a square actuator are equal; however, in other embodiments, dimensions 310 and 330 may be different from each other. FIG. 3 shows a schematic of actuators 121 spaced apart from each other by a gap 320. In various embodiments, gap 320 may be in the range of about 10 μm to about 1 mm; however, in other embodiments, gap 320 may be different. In various embodiments, actuators 121 may have a range of motion (i.e., extent of vertical travel toward the material to be patterned) of at least about 0.25 mm or of at least about 0.5 mm or of at least about 1 mm; however, the range of motion of actuators 121 is not a limitation of the present invention. In other embodiments, actuators 121 may have a range of motion (i.e., extent of vertical travel toward the material to be patterned) of at least about 10 μm or of at least about 50 μm or of at least about 100 μm.

In various embodiments, the speed or throughput of the patterning process is related to the speed with which patternable material 128 may be removed from substrate 125 as well as the actuator speed. In various embodiments, the actuators may resemble a dot matrix print head, where each dot in the dot matrix print head corresponds to an actuator 121. In various embodiments, composite material 130 may be processed by the patterning system at a rate of at least 5 meters/min or at least 10 meters/min or at least 25 meters/min or at least 50 meters/min.

In various embodiments, the patterning system may include one or more means to improve resolution by increasing the conformability of composite material 130 over actuator 121. For example, in various embodiments, composite material 130 may be heated before entering and/or within the patterning region (region of patterning head 120 and abrasion station 110), for example to soften composite material 130 and permit a relatively improved conformability of composite material 130 over actuators 121. In various embodiments of the present invention, pressure may be applied over or tension may be applied to composite material 130 in the region of actuators 121, to aid in conforming composite material 130 to actuator pin 121. In various embodiments of the present invention, pressure may be applied mechanically, for example by a work piece on one or both sides of actuator pin 121 (in direction 170). In various embodiments of the present invention, pressure may be applied in the form of gas pressure, for example air pressure, applied to the top surface of composite material 130 in the region of actuator pin 121 (e.g., on the side of composite material 130 opposite actuator pin 121). In various embodiments, the work piece or the gas may be heated.

Figure 4:
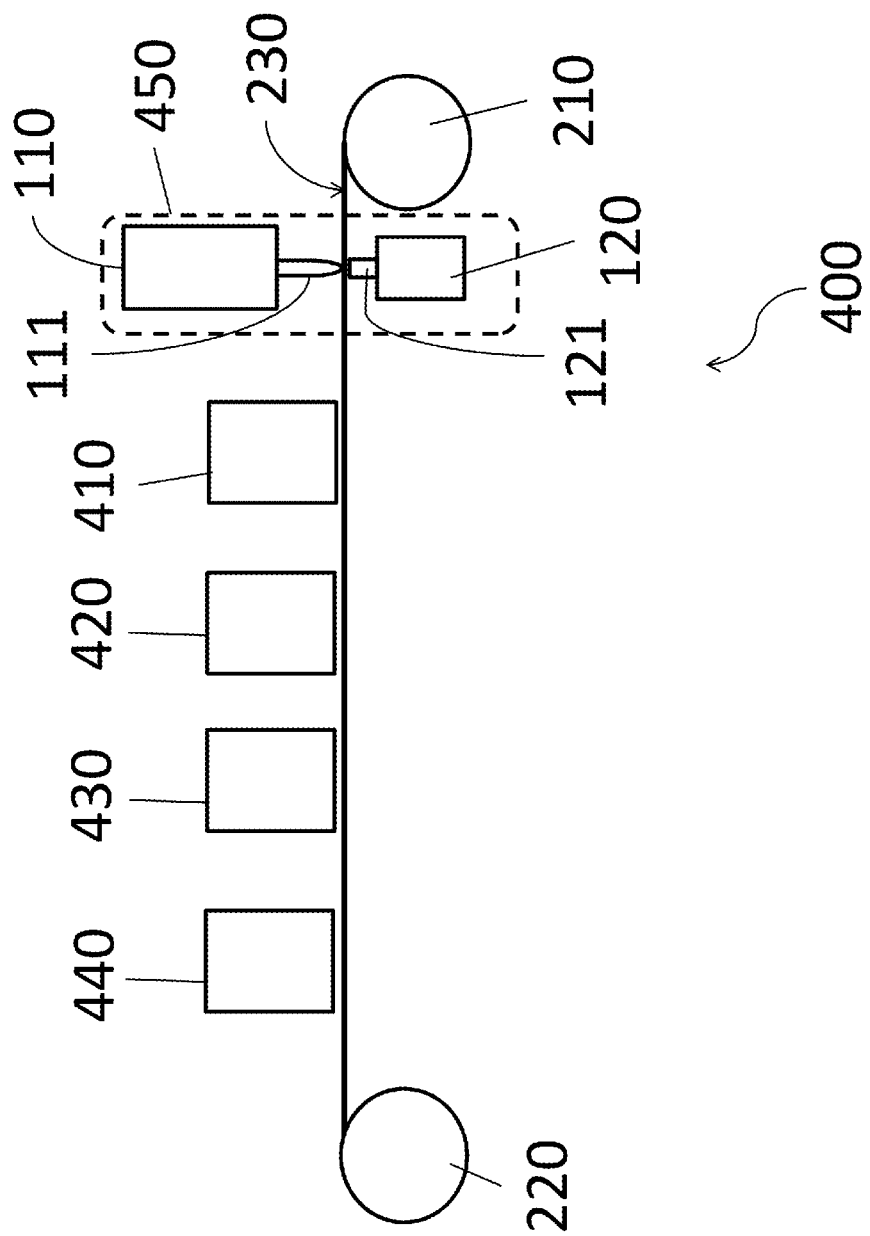
FIG. 4 is a cross-sectional schematic of a roll-to-roll manufacturing system in accordance with various embodiments of the invention.

In various embodiments, patterning systems of the present invention, such as patterning system 100 or 200, may be incorporated into other manufacturing systems, for example roll-to-roll manufacturing systems. FIG. 4 shows a system 400 for making flexible circuits in a roll-to-roll process in accordance with various embodiments of the present invention. In various embodiments, system 400 includes a supply reel 210 providing composite material 230 to a patterning station 450 (as described herein) to form a pattern of conductive traces on an insulating substrate (for example, aluminum on PET), an adhesive dispense station 410 to form conductive adhesive in the appropriate regions of web 230, a placement station 420 to place bare-die or packaged chips (e.g., light-emitting diodes) on web 230, a cure station 430 to cure the conductive adhesive, forming an electrical connection between the bare or packaged devices and the conductive traces on the insulating substrate, and a test station 440 to perform an in-line test of the finished circuit. While FIG. 4 shows stations 410 to 450 in the order described herein, this is not a limitation of the present invention, and in other embodiments systems and processes of the present invention may include fewer or more steps or stations and/or the steps or stations may be performed or positioned in different order. In various embodiments, system 400 may be utilized for the manufacture of radio frequency identification (RFID) components and/or light-emitting sheets (or "light sheets"), for example as described in U.S. patent application Ser. No. 13/799,807, filed on Mar. 13, 2013, U.S. patent application Ser. No. 13/970,027, filed on Aug. 19, 2013, U.S. Provisional Patent Application No. 61/985,759, filed on Apr. 29, 2014, and U.S. Provisional Patent Application No. 62/029,151, filed on Jul. 25, 2014, the entire disclosure of each of which is incorporated by reference herein.

In various embodiments, the adhesive may be an anisotropic conductive adhesive (ACA) as described in U.S. patent application Ser. No. 13/171,973, filed on Jun. 29, 2011, the entirety of which is incorporated by reference herein. In various embodiments, adhesive dispense station 410 may include or consist essentially of a reservoir for adhesive and a pressure dispense system, a jetting system, or the like; however, the means of dispensing adhesive is not a limitation of the present invention. In various embodiments, placement station 420 may include or consist essentially of a die placement tool, a flip-chip die placement tool, a surface mount device pick-and-place tool, or the like; however, the means of placing dies or packaged devices is not a limitation of the present invention. In various embodiments, cure station 430 may include or consist essentially of an applicator of at least one of pressure, heat, magnetic field, UV radiation, or the like (e.g., an oven, a hot plate, a UV lamp, a pressure cell, and/or one or more magnets or electromagnets); however, the means of curing the adhesive is not a limitation of the present invention. In various embodiments, the adhesive is cured using a thermode system (i.e., system in which heat and pressure are applied simultaneously by one or more heating elements). In various embodiments, test station 440 may include or consist essentially of, for example, a wafer prober including one or more electronic probes (e.g., one or more probe cards), a power supply, and one or more current meters and/or voltage meters.

In various embodiments, conductive traces are formed with a gap between adjacent conductive traces, and components (for example, resistors, transistors, diodes, light-emitting diodes (LEDs), integrated circuits, and the like) are electrically coupled to the conductive traces using conductive adhesive, e.g., an isotropically conductive adhesive and/or an ACA. ACAs may be utilized with or without stud bumps and embodiments of the present invention are not limited by the particular mode of operation of the ACA. For example, the ACA may utilize a magnetic field rather than pressure (e.g., the ZTACH ACA available from SunRay Scientific of Mt. Laurel, N.J., for which a magnetic field is applied during curing in order to align magnetic conductive particles to form electrically conductive "columns" in the desired conduction direction). Furthermore, various embodiments utilize one or more other electrically conductive adhesives, e.g., isotropically conductive adhesives, non-conductive adhesives, in addition to or instead of one or more ACAs. In other embodiments, components may be attached to and/or electrically coupled to conductive traces by other means, for example solder, reflow solder, wave solder, wire bonding, or the like. The means by which the components are attached to the conductive traces is not a limitation of the present invention.

Figure 5:
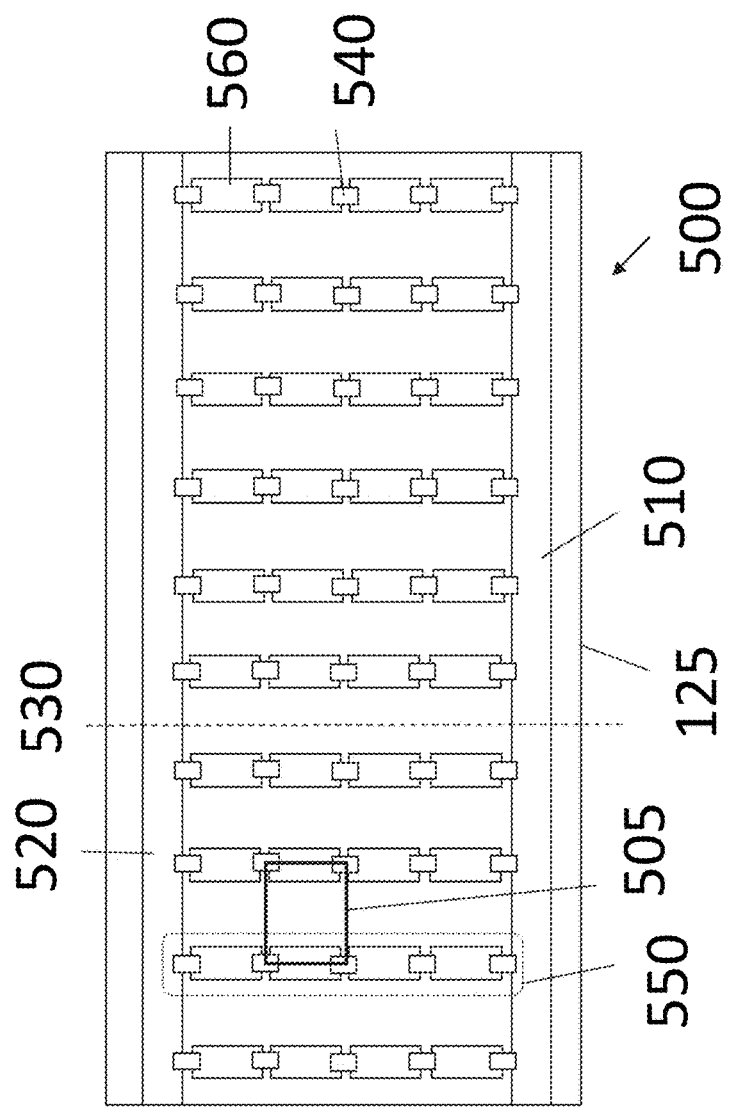
FIG. 5 is a plan-view schematic of an illumination device fabricated in accordance with various embodiments of the invention.

In various embodiments, systems like that shown in FIG. 4 may be utilized to manufacture flexible light sheets, where the flexible light sheet includes a substrate, conductive traces formed over the substrate and an array of light-emitting elements (LEEs) electrically interconnected by the conductive traces. FIG. 5 shows a schematic of an exemplary embodiment of a light sheet 500, which includes substrate 125, power conductors 510 and 520, and conductive elements 560, all formed of patternable material 128, for example as describe in U.S. patent application Ser. No. 13/799,807, filed on Mar. 13, 2013, U.S. patent application Ser. No. 13/970,027, filed on Aug. 19, 2013, and U.S. patent application Ser. No. 14/699,149, filed on Apr. 29, 2015, the entire disclosure of each of which is incorporated by reference herein. In various embodiments, substrate 125 includes, consists essentially of, or consists of PET, PEN, polyimide, glass, plastic, and/or paper, and substrate 125 may have a thickness in the range of about 5 μm to about 500 μm, or in the range of about 9 μm to about 125 μm. In various embodiments, patternable material 128 may include or consist essentially of copper, aluminum, carbon, gold, silver, silver ink, and/or conductive ink, and patternable material 128 may have a thickness in the range of about 50 nm to about 200 μm, or in the range of about 1 μm to about 100 μm. LEEs 540 may be electrically coupled to conductive elements 560, for example using adhesive, conductive adhesive, ACA, solder or the like, as described herein.

In various embodiments, multiple LEEs 540 may be interconnected with conductive elements 560 to form one or more strings 550. For example, LEEs 540 in a string 550 may be serially connected, and one end of string 550 may be electrically connected to power conductor 510 while the other end is electrically connected to power conductor 520. In various embodiments, LEEs 540 may be disposed in a regular periodic array, for example having a pitch (or "spacing") 505; however, this is not a limitation of the present invention, and in other embodiments LEEs 540 may be positioned in other patterns or randomly. In various embodiments, one or more additional elements may be electrically coupled to conductive traces 560 and/or power conductors 510, for example resistors, capacitors, inductors, transformers, diodes, integrated circuits, and the like. In various embodiments, light sheet 500 may be separable, via a cut 530 spanning the power conductors 510, 520 and not crossing a light-emitting string 550, into two partial light sheets that each include or consist essentially of (i) one or more light-emitting strings 550, and (ii) portions of the power conductors 510, 520 configured to supply power to and thereby illuminate the one or more light-emitting strings of the partial light sheet, for example as described in U.S. patent application Ser. No. 13/799,807, filed on Mar. 13, 2013, and U.S. patent application Ser. No. 13/970,027, filed on Aug. 19, 2013, the entire disclosure of each of which is incorporated by reference herein.

In various embodiments, light sheet 500 may be manufactured using a system similar to that shown in FIG. 4, starting with an input roll of composite material 130 (or web 230). In various embodiments, substrate 125 and patternable material 128 may initially separate and mated to form the composite material 130 in the system of FIG. 4, i.e., as part of the roll-to-roll process (e.g., substrate 125 and patternable material 128 may be supplied from different rolls and joined in an initial stage of the process). Various embodiments of the present invention may include multiple patterning stations, for example, more than one patterning station 450 as described with respect to FIG. 4. In another example, system 100 of FIG. 1A may have multiple abrasion stations 110 and corresponding patterning heads 120.

Figure 6:
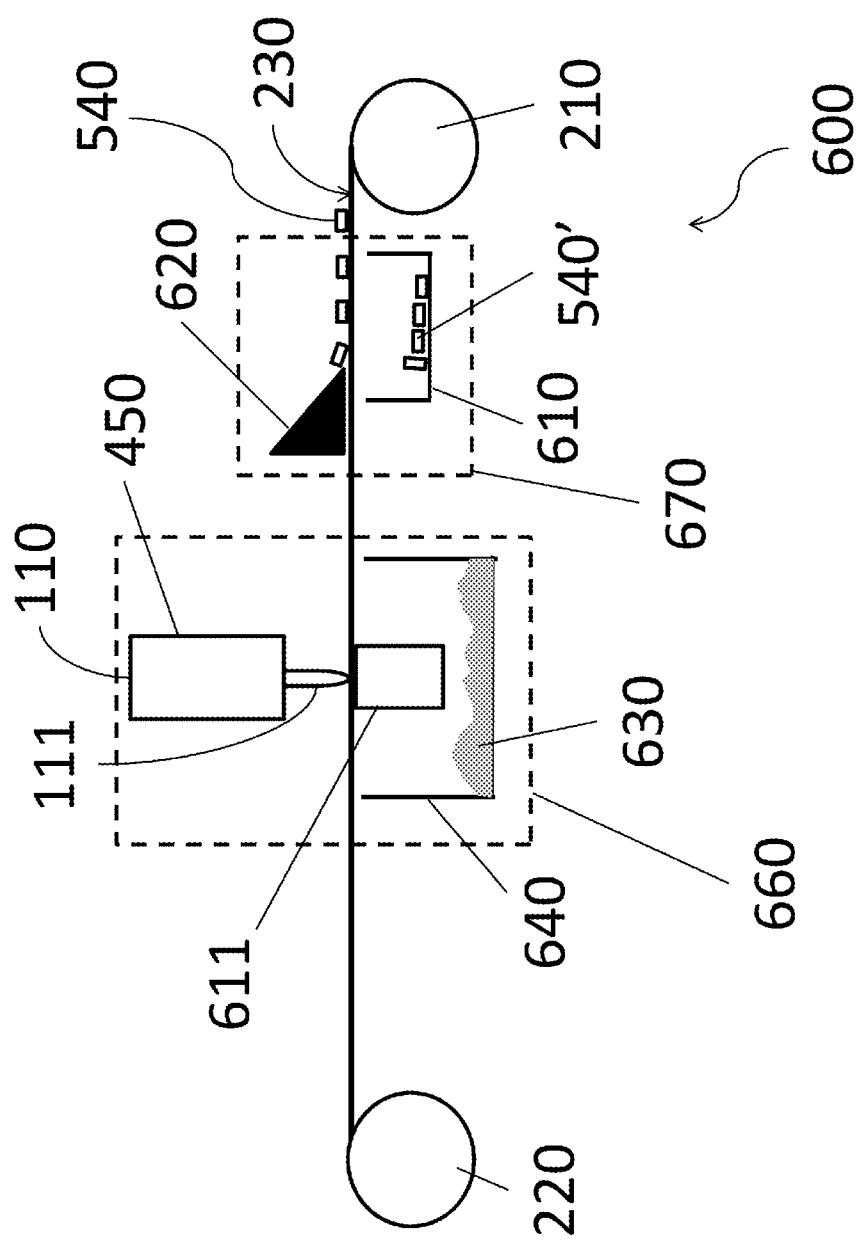
FIG. 6 is a cross-sectional schematic of a roll-to-roll recycling system in accordance with various embodiments of the invention.

In various embodiments of the present invention, all or portions of systems shown in FIG. 1A and/or FIG. 2 (or similar systems) may be used to recycle or partially recycle light sheets and similar materials or devices. For example, FIG. 6 shows an exemplary system 600 in accordance with embodiments of the present invention for recycling light sheets. System 600 includes supply reel 210 on which is mounted a web 230 that includes composite material 130 and LEEs 540, a component removal station 670, and a material removal station 660. In various embodiments, the composite material may be supplied in a roll, as shown in FIG. 6; however, this is not a limitation of the present invention, and in other embodiments composite material may be supplied in sheets and system 600 may be configured to handle individual sheets. In various embodiments, component removal station 670 is configured to remove at least portions of at least some of the components that are mounted on web 230, for example active devices, passive devices, switches, connectors, etc. In various embodiments of the present invention, component removal station 670 may include or consist essentially of a scraper 620 that may be configured to scrape off (e.g., mechanically remove) LEEs 540 and any other components, connectors, switches or the like mounted on composite material 130. Removed components, identified as 540', may be collected in a bin 610. After optional removal of components 540, material removal station 660 may be utilized to remove one or more layers from web material 230. In various embodiments of the present invention, patternable material 128 may be removed by abrasion head 111 at abrasion station 110.

In various embodiments, a positioner 611 may be utilized to urge composite material 130 to the proper height such that substantially all of patternable material 128 is removed from substrate 125 via mechanical interaction with the abrasion head 111. Removed patternable material, identified as 630 in FIG. 6, may be collected in a bin 640. In various embodiments in which patternable material 128 includes, consists essentially of, or consists of a metal such as aluminum or copper, removed patternable material 630 may be relatively easily recycled, as it may be relatively pure metal. In various embodiments of the present invention, there is no need for chemical removal and chemical separation of patternable material 630 from an etchant or other solution as is the case in conventional recycling systems.

While FIG. 6 shows stations 670 and 660 in the order described herein, this is not a limitation of the present invention and in other embodiments systems and processes of the present invention may include fewer or more steps or stations and/or the steps or stations may be performed or positioned in different order.

In various embodiments, the relative height of scraper 620 and abrasion head 111 may be adjusted to ensure complete removal of patternable material 128 or no removal of patternable material 128 or a balance in between, depending on the needs of the recycling system. In various embodiments, web 230 is supported under and/or urged toward abrasion head 111 (for example by positioner 611) and optionally supported under and/or urged toward scraper 620 (not shown in FIG. 6).

In various embodiments, the abrasion depth is controlled by a feedback system, for example using optical or electrical means to control the abrasion depth. In various embodiments in which patternable material 128 is electrically conductive, a circuit may be formed between abrasion head 111 and patternable material 128. When abrasion head 111 removes all patternable material 128 and contacts non-electrically conductive substrate 125, the circuit is broken, and this feedback may be used to raise and lower abrasion head 111 to the proper abrasion height. For example, controller 140 may be utilized to control the various components of system 600 in response to such feedback. In various embodiments, alternate feedback signals may be used. For example, in various embodiments in which substrate 125 is transparent or relatively transparent and patternable material 128 is not transparent or not relatively transparent to a wavelength of light, light including that wavelength of light incident upon the top of composite substrate 125 will not be detected from below, but once the patternable material is removed, the light may be detected and this signal may be used as a feedback signal to properly position abrasion head 111 to ensure optimal abrasion of patternable material 128 from substrate 125.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of recycling a device comprising a plurality of electronic components disposed over a flexible composite material, the flexible composite material comprising a flexible substrate and a patternable material disposed thereover, wherein the patternable material is patterned to form a pattern therein, the method comprising:
    receiving a portion of the device;
    removing one or more electronic components from the received portion of the device;
    locally deforming one or more regions of the received portion of the device to vertically urge the one or more regions toward an abrasion head without deforming or urging toward the abrasion head one or more other portions of the device, whereby the abrasion head mechanically removes at least a portion of the patternable material in each of the one or more regions; and
    repeating the above steps for one or more portions of the device.

2. The method of claim 1, wherein removing the one or more electronic components from the received portion of the device comprises mechanical scraping.

3. The method of claim 1, wherein one or more regions of the received portion of the device are vertically urged toward the abrasion head by being locally deformed by one or more actuators, the received portion of the device being disposed between the abrasion head and the one or more actuators.

4. The method of claim 3, wherein the one or more actuators comprise a plurality of actuators.

5. The method of claim 4, wherein (i) locally deforming the one or more regions of the received portion of the device comprises actuating one or more of the actuators, and (ii) one or more others of the actuators are not actuated thereduring.

6. The method of claim 1, further comprising storing the one or more removed electronic components after removal thereof.

7. The method of claim 1, further comprising storing the removed at least a portion of the patternable material after removal thereof.

8. The method of claim 1, wherein the portion of the device is received horizontally from a supply reel.

9. The method of claim 8, further comprising, after urging the one or more regions of the received portion of the device toward the abrasion head, transferring the received portion of the device horizontally to a take-up reel.

10. The method of claim 1, further comprising, after urging the one or more regions of the received portion of the device toward the abrasion head, transferring the received portion of the device horizontally to a take-up reel.

11. The method of claim 1, further comprising heating the received portion of the device before the at least a portion of the patternable material is removed.

12. The method of claim 1, further comprising applying pressure to a top surface of the composite material when the one or more regions of the received portion of the device are locally deformed, the one or more regions being locally deformed via mechanical force applied to a bottom surface of the composite material.

13. The method of claim 1, further comprising applying tension to the composite material when the one or more regions of the received portion of the device are locally deformed.

14. The method of claim 1, wherein, when the one or more regions of the received portion of the device are locally deformed and thereby vertically urged toward the abrasion head, one or more second regions of the received portion of the device are not locally deformed or vertically urged toward the abrasion head.

15. The method of claim 1, wherein the one or more regions of the received portion of the device are locally deformed in accordance with the pattern formed in the patternable material, only regions of the received portion of the device having patternable material disposed thereover being locally deformed and thereby vertically urged toward the abrasion head.

16. The method of claim 1, further comprising adjusting a depth of the mechanical removal based on a feedback signal.

17. The method of claim 16, wherein the feedback signal comprises an electrical feedback signal received via an electrical circuit formed with the patternable material.

18. The method of claim 16, wherein the feedback signal comprises an optical feedback signal received through the substrate.

19. The method of claim 1, wherein (i) the one or more electronic components are removed from a top surface of the device, and (ii) the at least a portion of the patternable material is mechanically removed from the top surface of the device.

20. A method of recycling a device comprising a plurality of electronic components disposed over a flexible composite material, the flexible composite material comprising a flexible substrate and a patternable material disposed thereover, wherein the patternable material is patterned to form a pattern therein, the method comprising:
    receiving a portion of the device horizontally from a supply reel;
    removing one or more electronic components from the received portion of the device;
    locally deforming one or more regions of the received portion of the device to vertically urge the one or more regions toward an abrasion head without deforming or urging toward the abrasion head one or more other portions of the device, whereby the abrasion head mechanically removes at least a portion of the patternable material from each of the one or more regions of the received portion of the device;
    thereafter, transferring the received portion of the device horizontally to a take-up reel; and
    repeating the above steps for one or more portions of the device.

21. The method of claim 20, wherein the one or more regions of the received portion of the device are vertically urged toward the abrasion head by being locally deformed by one or more actuators, the received portion of the device being disposed between the abrasion head and the one or more actuators.

22. The method of claim 20, further comprising storing the one or more removed electronic components after removal thereof.

23. The method of claim 20, further comprising storing the removed at least a portion of the patternable material after removal thereof.

* * * * *